(12) United States Patent
Tanaka et al.

(10) Patent No.: US 6,933,801 B2
(45) Date of Patent: Aug. 23, 2005

(54) DISTRIBUTED LOAD TRANSMISSION LINE MATCHING NETWORK

(75) Inventors: Tsutomu Tanaka, Santa Clara, CA (US); Stefan A. Wolff, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/045,515

(22) Filed: Oct. 26, 2001

(65) Prior Publication Data

US 2003/0080824 A1 May 1, 2003

(51) Int. Cl.⁷ ................................................ H01P 5/12
(52) U.S. Cl. ............................ 333/26; 333/115; 333/33; 315/111.21
(58) Field of Search ............................. 333/26, 33, 115, 333/116, 117

(56) References Cited

U.S. PATENT DOCUMENTS

| | | | | |
|---|---|---|---|---|
| 2,470,307 A | * | 5/1949 | Guanella | 333/34 |
| 3,025,480 A | * | 3/1962 | Guanella | 333/33 |
| 3,654,570 A | * | 4/1972 | Thomas | 333/11 |
| 4,641,111 A | * | 2/1987 | Chapell | 333/115 |
| 5,148,132 A | * | 9/1992 | Chapell | 333/115 |
| 5,283,087 A | * | 2/1994 | Yamazaki et al. | 427/577 |
| 5,350,479 A | | 9/1994 | Collins et al. | 156/345 |
| 5,689,215 A | | 11/1997 | Richardson et al. | 333/17.3 |
| 5,793,162 A | | 8/1998 | Barnes et al. | 315/111.21 |
| 5,874,704 A | | 2/1999 | Gates | 219/121.43 |
| 5,889,252 A | | 3/1999 | Williams et al. | 219/121.54 |
| 5,933,770 A | * | 8/1999 | Heiter | 455/307 |
| 5,952,896 A | | 9/1999 | Mett et al. | 333/32 |
| 6,043,607 A | | 3/2000 | Roderick | 315/111.21 |
| 6,106,737 A | | 8/2000 | Tomoyasu et al. | 216/67 |

* cited by examiner

*Primary Examiner*—Stephen E. Jones
(74) *Attorney, Agent, or Firm*—Townsend & Townsend and Crew (57) ABSTRACT

An apparatus and method for maximizing ac energy delivered to a load by minimizing energy reflected from a load, such as an RF power source coupled to a plasma load for substrate processing chambers, including a matching network, wherein the matching network couples an ac power source and load. The matching network having two transmissions lines that are inductively coupled for a fixed portion of their length, such length being at least one wavelength of the ac energy generated by the ac power source. The matching circuit providing continuously variable impedance matching through the use of fixed components.

14 Claims, 8 Drawing Sheets

DISTRIBUTED LOAD TRANSMISSION LINE MATCHING NETWORK

BACKGROUND OF THE INVENTION

The present invention relates to a matching circuit that reduces power reflected from a plasma formed in a substrate processing chamber. The invention is useful in a variety of technologies but is particularly useful in the manufacture of integrated circuits.

Plasma processing is a common step in the manufacture of integrated circuits. Common plasma processing steps include plasma enhanced chemical vapor deposition, reactive ion etching, and sputter etching among others. In such plasma processing steps, precise control of the plasma can be important in order to meet the manufacturing requirements of today's integrated circuits.

Typically a plasma is generated by applying RF energy to a coil or plates of a capacitor (inductive vs. capacitive coupling). To efficiently couple RF energy into a substrate processing chamber matching networks have been used to minimize the energy reflected from a plasma back into the RF generator. The source impedance of an RF generator is constant, typically 50 ohms resistive and zero ohms reactive, while the load of the plasma is transient and variable. The matching network matches the impedance of the load to an RF source from the perspective of the source. Thus, matching networks maximize RF power supplied to the load by minimizing the RF energy reflected from the load.

Figure 1:
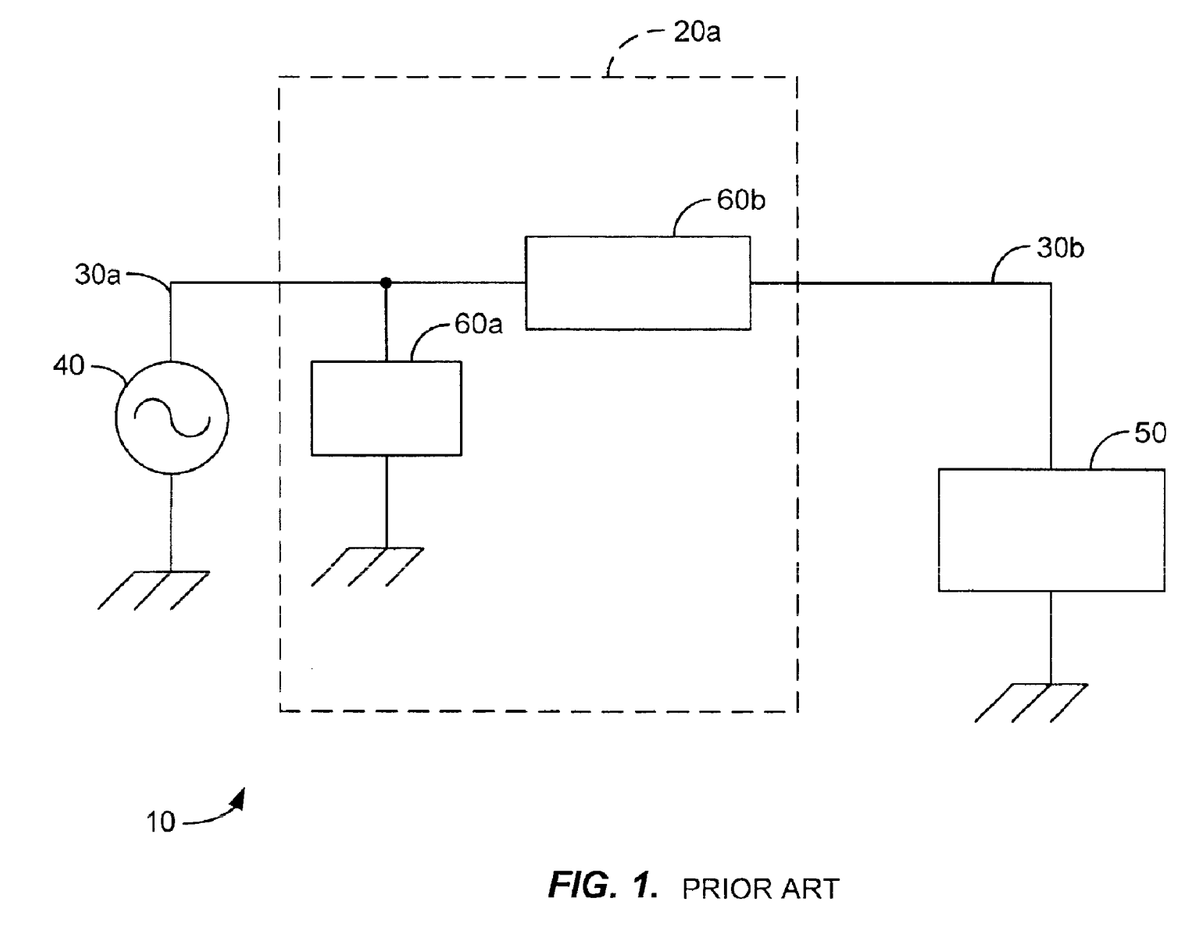
FIG. 1 is a block diagram of a prior art ac energy delivery system that includes an L-network, matching network.

A variety of matching networks have been developed and successfully used in substrate processing. FIG. 1 is a block diagram of a previously known ac energy delivery system 10. As shown in FIG. 1, energy delivery system 10 includes a matching network 20a coupled by transmission lines 30a–b between an ac power source 40 and a plasma load 50. The matching network is comprised of tuning elements 60a–b that include capacitors, or inductors, or both. The matching network of FIG. 1, having tuning element 60a in parallel with the ac power source and the plasma load and having tuning element 60b in series with the source and load is commonly referred to as an "L network."

Figure 2:
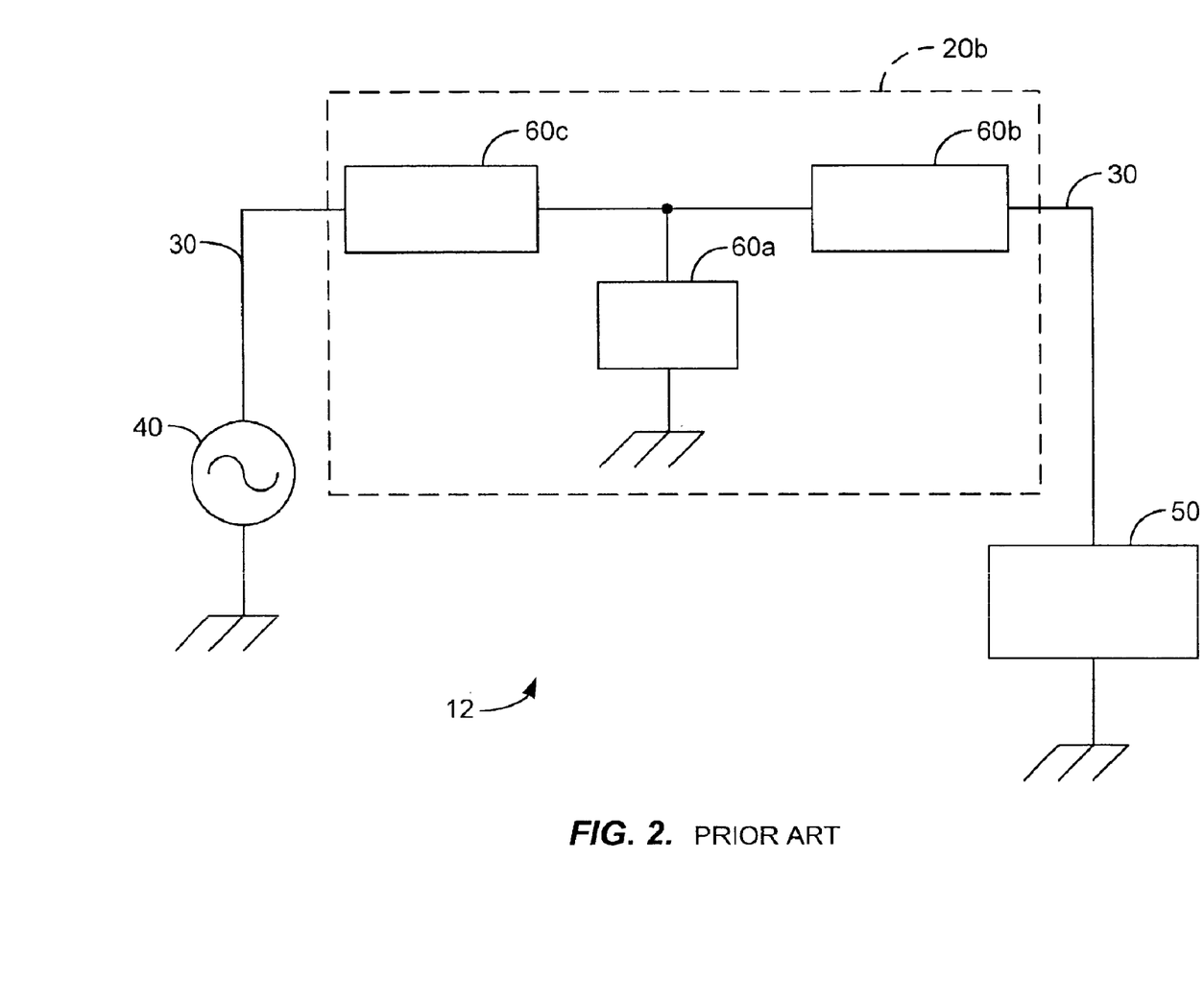
FIG. 2 is a block diagram of a prior art ac energy delivery system that includes a T-network, matching network.
Figure 3:
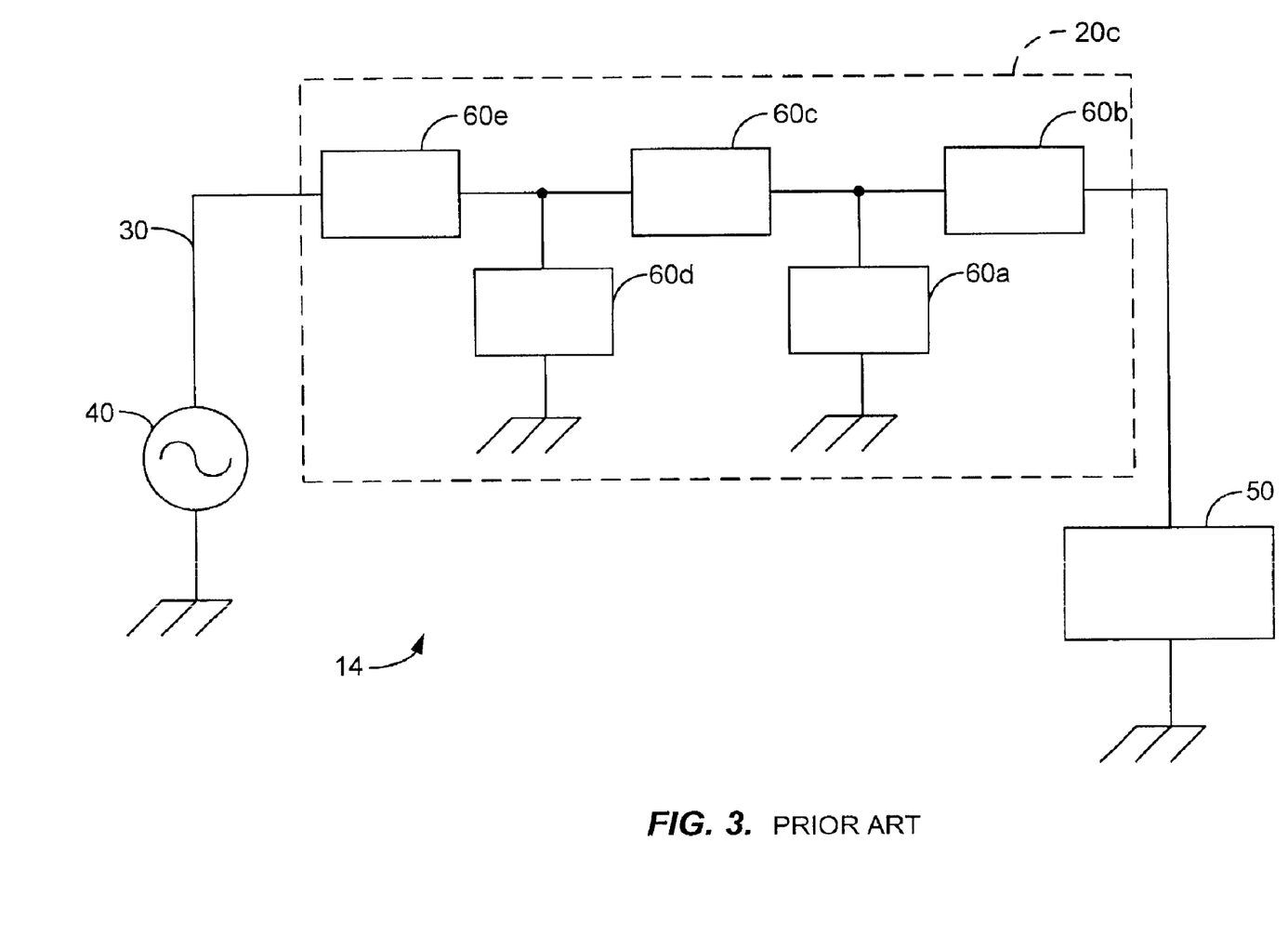
FIG. 3 is a block diagram of a prior art ac energy delivery system that includes π-network, matching network.

FIGS. 2 and 3 are block diagrams of energy delivery systems 12 and 14 having other previously known matching networks 20b and 20c, respectively. Matching network 20b of FIG. 2 is commonly referred to as a "T network." T networks typically have one tuning element 60a coupled in parallel with the ac power source 40 and plasma load 50 and have two tuning elements 60c and 60b in series with the ac power source and plasma load. Matching network 20c shown in FIG. 3 is commonly referred to as a "π network." Typically π networks have two tuning elements 60a and 60d coupled in parallel with ac power source 40 and plasma load 50 while having three tuning elements 60b, 60c and 60e in series with the ac power source and plasma load.

The tuning range of a matching network is a measure of the range of impedance for which disparate load and source impedances can be effectively matched. For example, if the impedance of an ac power source is 50 ohms resistive and a load is 100 ohms resistive and 10 ohms reactive but varies by +/−10 ohms resistive and +/−5 ohms reactive, a matching network tuning range would be sufficiently broad to effectively match these impedances. The tuning range of a matching network is typically related to the number of tuning elements in the network. Thus, a π network typically has a broader tuning range than a T network and a T network typically has a broader tuning range than an L network.

However, matching networks having a relatively large number of tuning elements have a relatively higher resistance than matching networks having fewer tuning elements. Thus, total ac energy transfer is typically lower in matching networks with a relatively large number of tuning elements.

Matching networks such as networks 20a–20c shown in FIGS. 1–3 can include tuning elements that are fixed or variable. Variable tuning elements, which include variable capacitors, and/or variable inductors, provide a matching network with continuously adjustable impedance matching. Such continuous adjustability provides the benefit of continuously matching the impedance of an ac power source to a load that has transient and variable impedance. Thus, a controllable amount of energy may be transferred to a load. For example, if the load is a plasma having a transient and variable impedance, by supplying a controllable amount of energy to the plasma through impedance matching, the plasma can be maintained in a relatively stable state.

Figure 4:
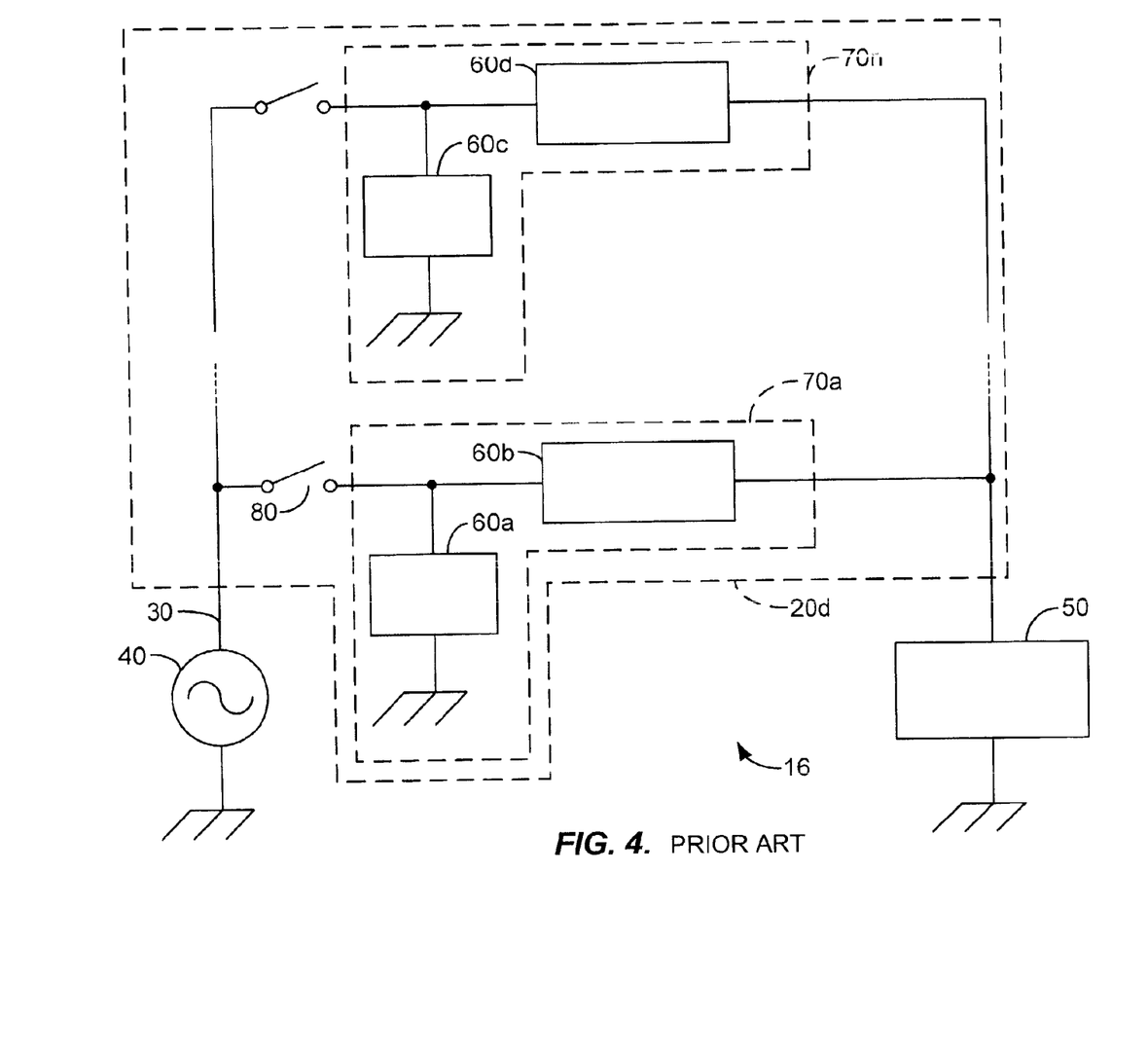
FIG. 4 is a block diagram of a prior art ac energy delivery system that includes a matching network having banks of parallel tuning elements coupled to connecting switches.

The cost of variable components is considerably higher than the cost of fixed components. Thus, matching networks that use fixed components are generally less expensive than matching networks that use variable components. Such fixed-element matching networks have limited impedance matching capability, however. Thus, optimal impedance matching is not always achieved with fixed components. To partially overcome the lack of continuous adjustability using fixed components, some previously known matching networks include parallel banks of fixed component tuning elements to provide step wise adjustability. FIG. 4 is a block diagram of an energy delivery system 16 having a step wise adjustable matching network 20d. Step wise adjustability is achieved by switching banks of tuning elements 70a . . . n into or out of connection with ac power source 40. Each bank of tuning elements 70a . . . n can be any of the previous described configurations of tuning elements, "L network", "T network" or "π network." While step wise adjustable matching networks provide improved impedance matching capabilities, such matching networks have regions for which optimal energy coupling to a plasma load cannot occur.

Accordingly, it is desirable to develop matching networks that have low cost fixed components while providing improved impedance matching over a broad range of RF wavelengths and high energy transfer.

SUMMARY OF THE INVENTION

The previously identified needs as well as other needs are solved by embodiments of the present invention, which provide an apparatus and method for matching the impedance of a load to an ac power source. The apparatus includes a matching network coupled between an ac power source and a load. The matching network provides an increased tuning range for matching the impedance of the ac power source to the load. More specifically, an ac power source having a fixed source impedance can be matched to a load having a transient and variable impedance while the matching network effectively minimizes ac energy reflected from the load by improving power delivered to the load.

Embodiments of the present invention provide the above recited features through the use of two transmission lines that inductively couple an ac power source to a load. To both maximize ac energy transferred to the load and to minimize reflected energy, a fixed length of two transmission lines are placed in close proximity for at least one wavelength of the ac energy produced by the ac power source.

The apparatus and methods of use of the present invention are important to the manufacture of integrated circuit devices in which an RF source having a fixed impedance is coupled to a plasma load having a transient and variable impedance. The present invention is applicable to an ac energy delivery system in which ac energy delivered to a load needs to be maximized through the minimization of reflected energy. In integrated circuit manufacture plasma processes, both deposition and removal processes are less reliable when reflected energy is not minimized. Embodiments of the invention can be used to minimize reflected energy for plasma processes through the inductive coupling of an RF source to a plasma load by inductively coupling two transmission lines for at least one wavelength of RF energy, thus stabilizing plasmas used in the manufacture of integrated circuits.

These and other embodiments of the present invention, as well as its advantages and feature are described in more detail in conjunction with the text below and attached figures.

DETAILED DESCRIPTION OF PREFERRED EMBODIMENTS

Figure 5:
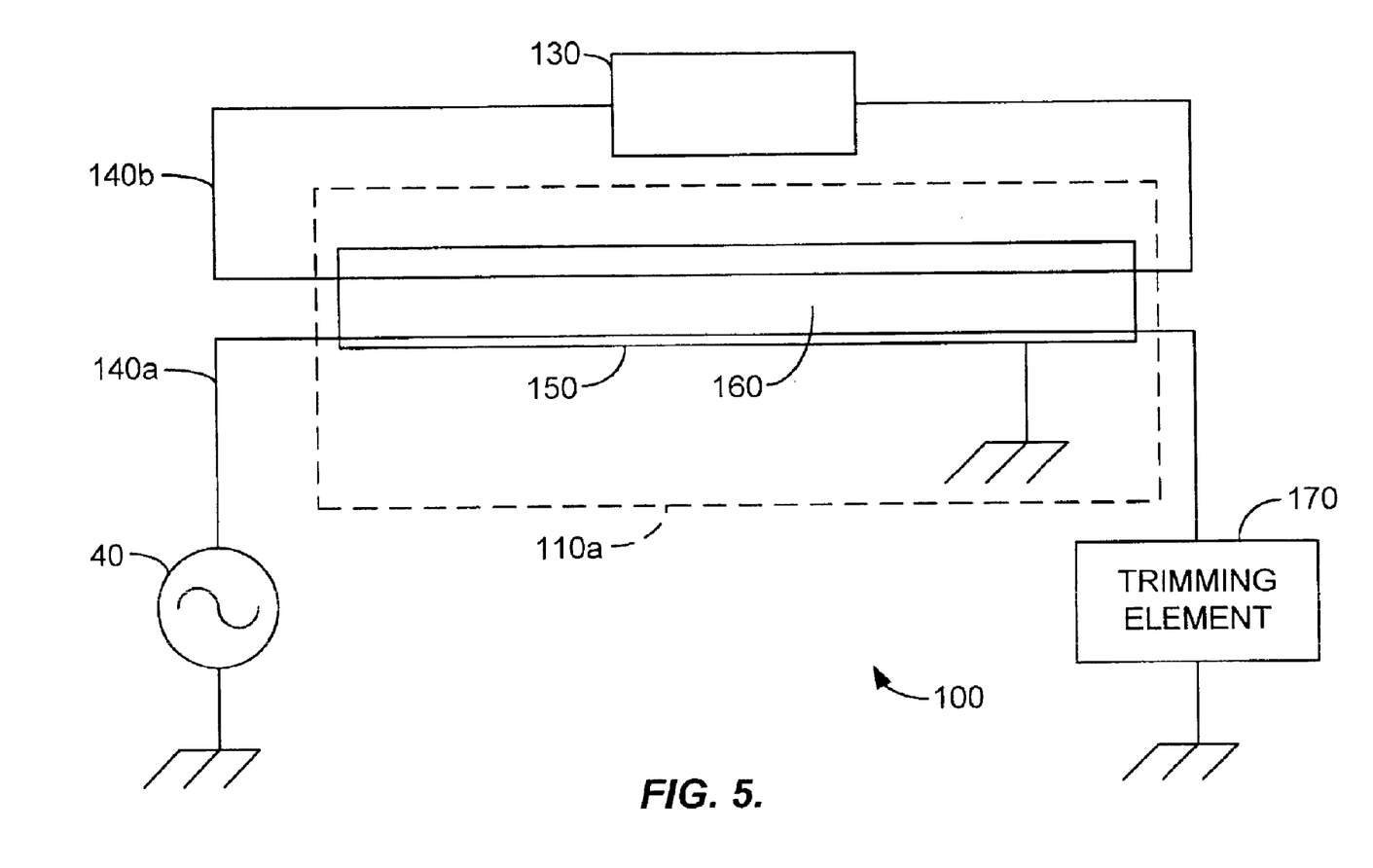
FIG. 5 is a block diagram of an ac energy delivery system that includes one embodiment of a matching network of the present invention.
Figure 7A:
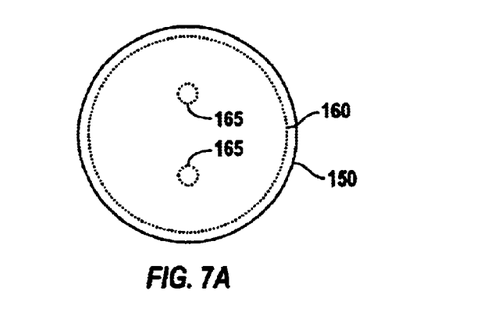
FIGS. 7A–7D are diagrams of insulators within ground shields according to embodiments of the present invention.
Figure 7B:
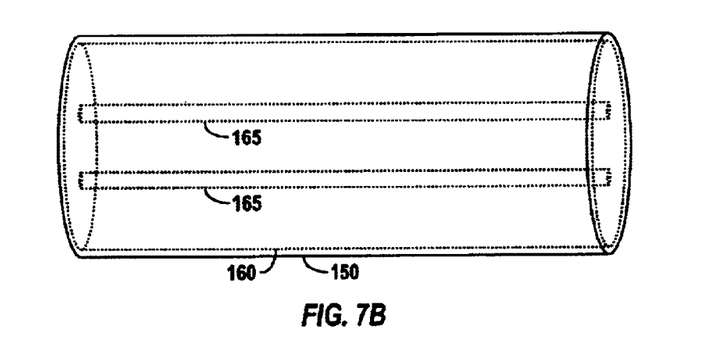

FIG. 5 is a block diagram of an ac energy delivery system 100 according to one embodiment of the present invention. AC energy delivery system 100 includes a matching network 110a that inductively couples an ac power source 120 to a load 130, such as a plasma processing chamber. The ac power source is coupled to a transmission line 140a to deliver ac energy to the transmission line. Transmission line 140a is inductively coupled to a second transmission line 140b. Transmission line 140b is further coupled to the load 130. Transmission line 140b inductively receives ac energy from transmission line 140a and further delivers the ac energy to the load 130. The mutual inductance of two transmission lines is proportional to the length of both of the transmission lines and inversely proportional to the distance between them. To effectively control the mutual inductance of the two transmission lines 140a–b they are placed within close proximity of each other and are enclosed within a single ground shield 150 for a limited portion of their overall length. Typical spacing between the transmission is in the range of about 5 cm to 0.5 cm. The portion of the two transmission lines not inside ground shield 150 may be enclosed in separate ground shields that limit the mutual inductance of the transmission lines. The length that the two transmission lines are inductively coupled is herein after referred to as an "inductive length." FIG. 5 shows the two transmission lines to be parallel within the inductive length. An insulator 160 holds the transmission lines 140a–b in a fixed parallel position. FIGS. 7A and 7B show varying views of insulator 160 inside ground shield 150. FIG. 7A shows insulator 160 (having a dashed outline) inside ground shield 150 (having a solid outline) from an end perspective; central circles 165 represent openings into which the first and second transmission lines are placed. FIG. 7B shows a side view of insulator 160 inside of ground shield 150. Central openings 165 are parallel to fix the first and second transmission lines in a parallel position as previously described.

Energy transfer from the ac power source and first transmission line to the second transmission line and load is improved if the inductive length is at least one wavelength of the ac energy. Thus, in order to ensure energy reflected from the load back to the ac power source is effectively minimized, the inductive length should be at least one wavelength of the ac energy. AC energy traveling in transmission line 140a not inductively coupled to transmission line 140b is prevented from reflecting from ground by a trimming element 170. Trimming element 170 is typically a resistor used to match the transmission line impedance to ground.

One application of the matching circuit of the present invention is to couple an RF source to a gaseous species within a substrate processing chamber to generate a plasma. For a substrate processing system, typical ac energy delivered by an ac power source ranges from radio frequencies to microwave frequencies, approximately 100 kHz to 2.45 GHz. Typical RF energy used for plasma generation is in the range of about 350 kHz to 400 MHz. Thus, the inductive length of the transmission lines of the present invention is in the range of 3000 meters to about 0.12 meters and more typically between about 857 meters to about 0.75 meters. These inductive coupling lengths are quite long with respect to other equipment used in substrate processing. To make the embodiments of the present invention practical for use, the transmission lines and ground shield can be bent into various shapes to reduce their overall dimensions. For example, the transmission lines and ground shield can be bent into spirals, coils, or serpentines as well as other shapes (see FIG. 7D). Such shapes can be less than a meter across in any direction, thus, making the dimensions of the transmission lines practical for use. In embodiments of the present invention discussed below, these dimensional issues are further addressed.

Figure 6:
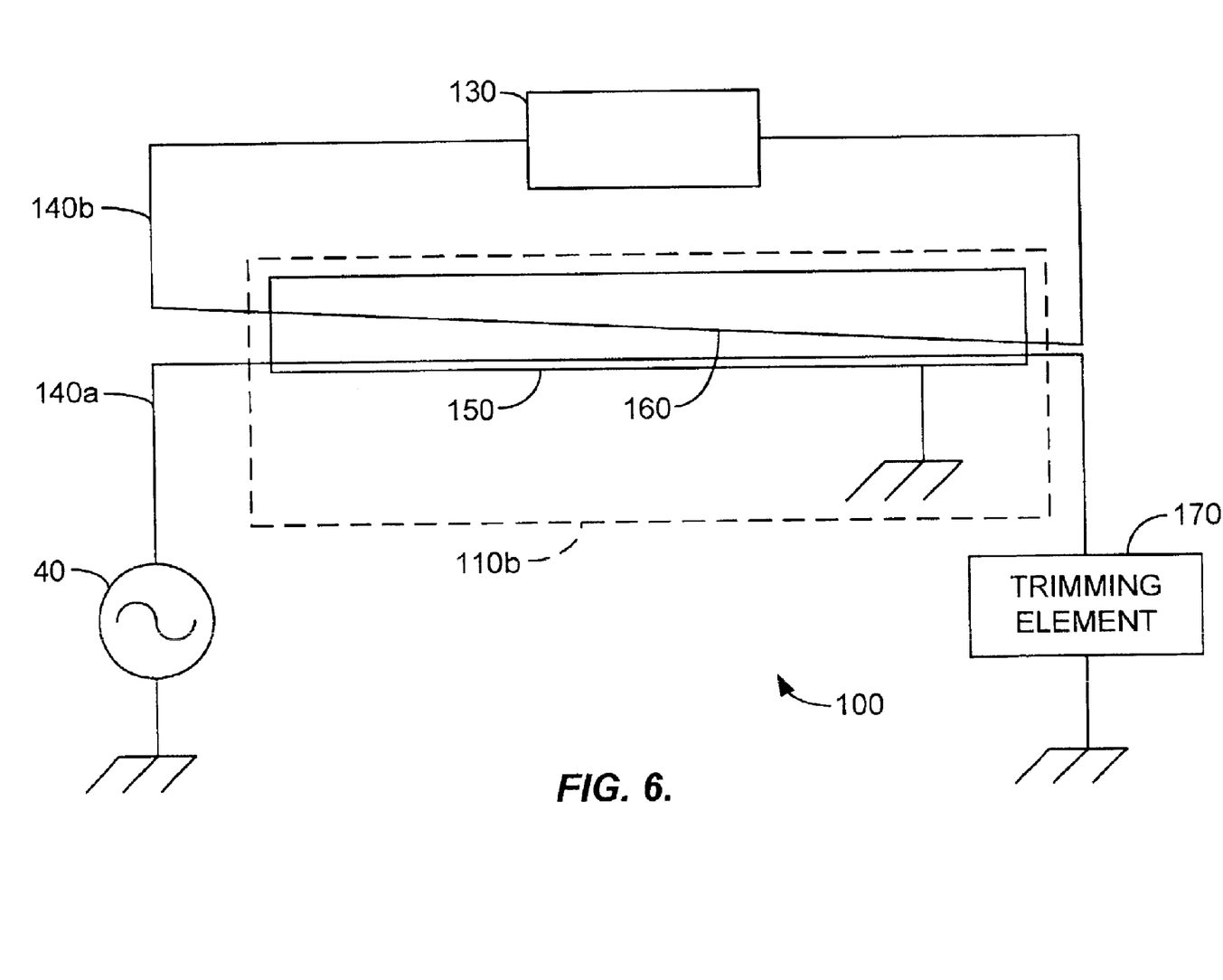
FIG. 6 is a block diagram of an ac energy delivery system that includes another embodiment of a matching network of the present invention.
Figure 7C:
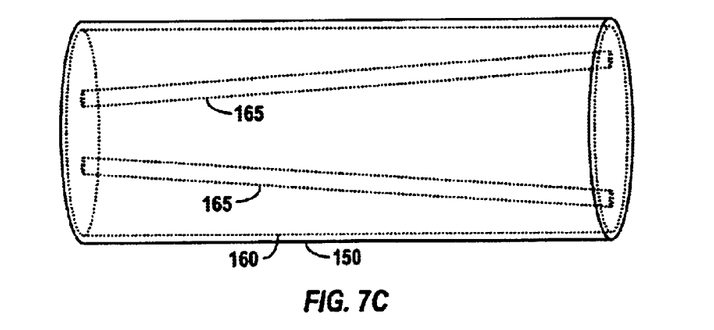
Figure 7D:
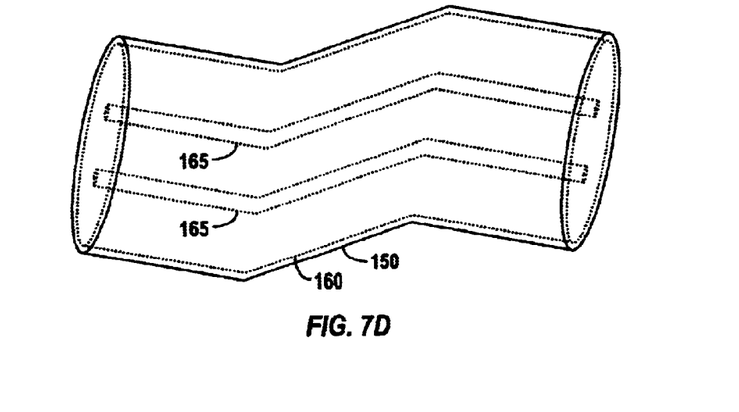

FIG. 6 is a block diagram of an AC energy deliver system 100 according to a second embodiment of the present invention. As similarly shown in FIG. 5 and similar to previously described embodiments, AC energy system 100 includes a matching network 110b that inductively couples an AC power source 120 to a load 130, such as a plasma processing chamber. The ac power source is coupled to transmission line 140a to deliver ac energy to the transmission line. Transmission line 140a is inductively coupled to a second transmission line 140b. Transmission line 140b is further coupled to the load 130. Transmission line 140b inductively receives ac energy from transmission line 140a and further delivers the ac energy to the load 130. First and second transmissions lines 140a and 140b are inductively coupled over an inductive length of at least one wavelength of incident ac energy. The spacing between the first and second transmission lines as shown in FIG. 6 varies along the length of the lines. Similarly described, the angle between the two transmission lines is non-zero. The transmission lines are held fixed within insulator 160. FIG. 7C shows a side view of insulator 160 inside ground shield 150. Openings 165 in insulator 160 are positioned such that the transmission lines are fixed as previously described.

The variable spacing between the transmission lines as shown in FIG. 6 minimizes ac energy reflected from the load to the ac power source if the inductive length is at least one wavelength of the ac energy generated by the source. AC energy traveling in transmission line 140a not inductively coupled to transmission line 140b is prevented from reflecting from ground by a trimming element 170.

Figure 8:
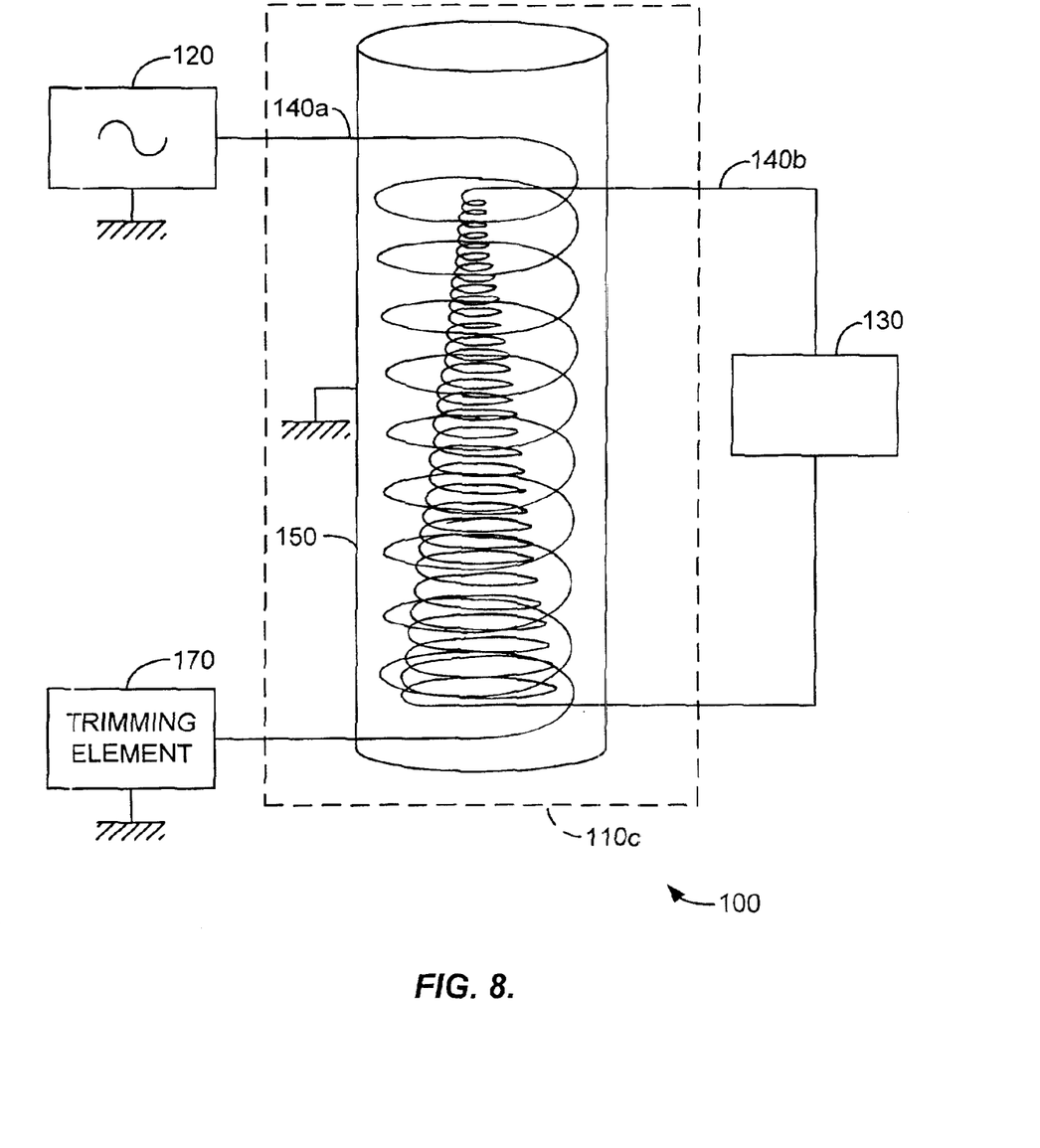
FIG. 8 is a block diagram of an ac energy delivery system that includes another embodiment of a matching network of the present invention.

FIG. 8 is a block diagram of AC energy delivery system 100 incorporating a third embodiment of a matching network 110c of the present invention. The matching network inductively couples an ac power source 120 to a load 130, such as a plasma processing chamber. The ac power source is coupled to a transmission line 140a to deliver ac energy to the transmission line. Transmission line 140a is inductively coupled to a second transmission line 140b. Transmission line 140b is further coupled to the load 130. Transmission line 140b inductively receives ac energy from transmission line 140a and further delivers the ac energy to the load 130. In the third embodiment transmission lines 140a–b are both coiled. The coils of transmission line 140a have a constant radius of curvature, while the coils of transmission line 140b have a radius of curvature that increases from one end of the coils to the other end. The coils of transmission line 140a surround the coils of transmission line 140b. Similar to the previously discussed embodiments, to minimize reflected ac energy, both transmission lines are inductively coupled for at least one wavelength of ac energy generated by the ac power source. Similarly described, the transmission lines have an inductive length of at least one wavelength of ac energy generated by the ac power source. This embodiment is relatively physically small as compared to the previously described embodiments and further spiraling, coiling, or serpentineing of the ground shield and enclosed transmission lines is generally not necessary.

A number of different embodiments of matching networks have been described above, as well as methods for use. As will be appreciated by one of ordinary skill in the art, the embodiments described above are exemplary only. The present invention has application for other ac power delivery systems when power transfer needs to me maximized through minimal reflection for an ac power source coupled to a load, when both source and load have either real or complex impedances that are mismatched.

Although the present invention has been described and illustrated in detail, it is to be clearly understood that the above descriptions and illustrations are by way of example only and are not to be taken as limiting the invention, the spirit and scope of the present invention being limited only by the terms of the appended claims.

What is claimed is:

1. A matching network that can be coupled between an ac power source and a load to reduce ac energy reflected from said load, said matching network comprising:
   (a) a first transmission line that can be coupled to said ac power source;
   (b) a second transmission line inductively coupled to said first transmission line, wherein said first and second transmission lines are inductively coupled for an inductive length, said inductive length being at least one wavelength of ac energy supplied by said ac power source, wherein said second transmission line can be coupled to said load to deliver ac energy from said first transmission line to said load, and wherein said first and second transmission lines within said inductive length are a substantially fixed distance apart and are bent to reduce their overall dimension; and
   (c) an insulator having first and second holes formed therein, wherein the first transmission line is disposed in the first hole and the second transmission line is disposed in the second hole, and wherein the insulator is bent substantially similar to the first transmission line and the second transmission line.

2. The matching network of claim 1 wherein said inductive length is at least 0.75 meters.

3. The matching network of claim 1 further comprising:
   (d) a trimming element coupled to said first transmission line and coupled to ground.

4. The matching network of claim 1, wherein the first and second transmission lines are bent to reduce their overall dimension to approximately a meter or less along any direction.

5. The matching network of claim 1, wherein the first and second transmission lines are bent in a spiral to reduce their overall dimension.

6. An energy delivery system comprising:
   an ac power source capable of generating an ac signal of at least 100 KHz;
   a matching network having i) a first transmission line that can be coupled to said ac power source, ii) a second transmission line inductively coupled to said first transmission line, wherein said first and second transmission lines are inductively coupled for an inductive length, said inductive length being at least one wavelength of ac energy supplied by said ac power source, and said inductive length being at least 0.75 meters, and wherein said first and second transmission lines within said inductive length are a substantially fixed distance apart and are bent to reduce their overall dimension, and iii) an insulator having first and second holes formed therein, wherein the first transmission line is disposed in the first hole and the second transmission line is disposed in the second hole, and wherein the insulator is bent substantially similar to the first transmission line and the second transmission line; and
   a load coupled to said second transmission line.

7. The matching network of claim 6 wherein said ac power source is an RF generator and said load is a plasma.

8. A substrate processing system comprising:
   (a) an RF generator;
   (b) a substrate processing chamber; and
   (c) a matching network having i) a first and a second transmission line, said first transmission line being coupled to said RF generator; said second transmission line being coupled to said substrate processing chamber, wherein said first and second transmission lines are inductively coupled over an inductive length, said inductive length being at least one wavelength of ac energy supplied by said RF generator, and wherein said first and second transmission lines within said inductive length are an approximately fixed distance apart and are bent to reduce their overall dimension, and ii) an insulator having first and second holes formed therein, wherein the first transmission line is disposed in the first hole and the second transmission line is disposed in the second hole, and wherein the insulator is bent substantially similar to the first transmission line and the second transmission line.

9. A method for minimizing reflected ac power from a plasma formed in a substrate processing chamber, said method comprising:

generating an ac power signal having a specified wavelength and transmitting said signal to a first transmission line that is inductively coupled to a second transmission line over an inductive length, wherein said inductive length is at least one of said specified wavelength, and wherein said first and second transmission lines within said inductive length are a substantially fixed distance apart and are bent to reduce their overall dimension, and wherein the first transmission line is disposed in a first hole formed in an insulator and the second transmission line is disposed in a second hole formed in an insulator, and wherein the insulator is bent substantially similar to the first transmission line and the second transmission line; and transmitting said ac power signal from said second transmission line to a substrate processing chamber.

10. The method of claim 9 wherein said ac power signal has a frequency range of operation between 100 KHz to 2.45 GHz and said inductive length is between 3000 and 0.12 meters.

11. The method of claim 9 wherein said ac power signal has a frequency between 350 KHz and 400 MHz and said inductive length is between 857 meters and 0.75 meters.

12. A method for minimizing reflected ac power from a plasma formed in a substrate processing chamber, said method comprising:

coupling an ac power source generating ac energy of a specified wavelength to said plasma in said substrate processing chamber;

coupling a matching network between said ac power source and said plasma, said matching network comprising:

a first transmission line and a second transmission line, wherein said first and second transmission lines are inductively coupled over an inductive length, said inductive length being at least one of said specified wavelength, and wherein said first and second transmission lines within said inductive length are a substantially fixed distance apart and are bent to reduce their overall dimension, and an insulator having first and second holes formed therein, wherein the first transmission line is disposed in the first hole and the second transmission line is disposed in the second hole, and wherein the insulator is bent substantially similar to the first transmission line and the second transmission line.

13. The method of claim 12 wherein said first transmission line receives ac energy from said ac power source, said second transmission line inductively receives ac energy from said first transmission line, and said second transmission line delivers ac energy to said plasma.

14. The method of claim 12 wherein said first and second transmission lines within said inductive length are parallel.

* * * * *